United States Patent [19]
Knight et al.

[11] Patent Number: 6,028,875
[45] Date of Patent: Feb. 22, 2000

[54] BURIED HETEROSTRUCTURE LASER WITH QUATERNARY CURRENT BLOCKING LAYER

[75] Inventors: Douglas Gordon Knight, Munster; Chunmeng Wu, Montreal, both of Canada

[73] Assignee: Nortel Networks Corporation, Montreal, Canada

[21] Appl. No.: 08/728,991

[22] Filed: Oct. 11, 1996

[51] Int. Cl.$^7$ .................................................. H01S 3/19
[52] U.S. Cl. .................. 372/46; 372/45; 372/48
[58] Field of Search .................. 372/46, 45, 92, 372/48

[56] References Cited

U.S. PATENT DOCUMENTS

| | | | |
|---|---|---|---|
| 4,429,397 | 1/1984 | Sugimoto et al. | 372/46 |
| 4,546,479 | 10/1985 | Ishikawa et al. | 372/45 |
| 4,782,035 | 11/1988 | Fujiwara | 437/129 |
| 4,905,057 | 2/1990 | Ohishi et al. | 357/17 |
| 5,375,135 | 12/1994 | Okumura et al. | 372/46 |
| 5,448,581 | 9/1995 | Wu et al. | 372/45 |

OTHER PUBLICATIONS

Laboratory of Artificial Semiconductor Materials, Dept. of Electronics, Royal Institute of Technology (KTH), Sweden, "Semi–insulating Materials", located at www.ele.kth.se/HMA/research/semi.htm, Apr. 1997.
Ben G. Streetman, "The GaAs MESFET", Solid State Electronic Devices, Fourth Edition, p. 295, paragraph 8.2.1, 1995.
Ben G. Streetman, "The Fermi Level", Solid State Electronic Devices, Fourth Edition, pp. 71–73, paragraph 3.3.1, 1995.
M. Sugawara, et al., "Fe acceptor level in InGaAsP/InP", Appl. Phys. Lett. 51(11), pp. 834–836, Sep. 1987.
Hecht, J., Understanding Lasers, Second Edition, IEEE Press, New York, 1994, pp. 277–279.
R.F.Karlicek Jr., D.L. Coblentz, R.A.Logan, T.R.Hayes, R. Pawelek & E.K.Byrne, "A Modified Metalorganic Chemical Vapor Deposition Chemistry for Improved Selective Area Regrowth", Journal of Crystal Growth 131 (1993) pp. 204–208. (No Month).
B.T.Lee, R.A.Logan & R.F.Karlicek Jr., "Planar Regrowth of InP and InGaAs Around Reactive Ion Etched Mesas Using Atmospheric Pressure Metalorganic Vapor Phase Epitaxy", Appl. Phys. Lett. 63 (2) Jul 12, 1993, pp. 234–236.
R.Westphalen, B.Elsner, M.Maassen, O.Kayser, K.Heime & P.Balk, "Selective Embedded Growth By LP–MOVPE in the Ga–In–As–P System", Journal of Crystal Growth 125 (1992) pp. 347–362. (No Month Available).
D.G.Knight, W.T.Moore, & R.a.Bruce, "Growth of Semi–insulating InGaAsP Alloys Using Low–pressure MOCVD", Journal of Crystal Growth, 124 (1992) pp 352–357. (No Month).
C.M.Wu, M.Svilans, M.Fallahi, I.Templeton, T.Makino, J.Glinski, R.Maciejko, S.I.Najafi, C.Blaauw, C.Maritan & D.G.Knight, "Electrically Pumped Circular–Grating Distributed–Bragg–Reflector Lasers", 1992 IEEE, PP 960–963. (Sep.).
D.G.Knight, C.J.Miner, B.Watt, C.M. Wu, K.Fox, B. Emmerstorfer, C.Maritan & J.Hennessy, "Optimization of Selective Area Epitaxy for Fabrication of Circular Grating Distributed–Bragg–reflector Surface–emitting Lasers", Journal of Crystal Growth, 134 (1993) pp 19–28. (no month).

(List continued on next page.)

Primary Examiner—James W. Davie
Assistant Examiner—Sung T. Kim

[57] ABSTRACT

The lateral confinement region provided on both sides of an active region stripe of a buried heterostructure laser is formed of an alloy of InGaAsP instead of the conventional Fe doped InP material. This results in much improved regrowth morphology while still achieving good current and light blocking properties.

23 Claims, 5 Drawing Sheets

OTHER PUBLICATIONS

C.P.Seltzer, S.D.Perrin, M.J.Harlow, R.Studd & P.C.Spurdens, "Long–term Reliability of Strain–compensated InGaAs(P)/InP MQW BH Lasers", IEEE Nov. 1994 Nov. 25, 1993 Electronics Letters Online No. 19940/150.

S.Matsumoto, M.Fukuda, K.Sato, Y.Itaya & M.Yamamoto, "Highly Reliable 1.55ηm GaInAsP Laser Diodes Buried with Semi–insulating Iron–doped InP", Electronics Letters, Aug. 4, 1994, Vol. 30, No. 16, pp 1305–1306.

N.Nordell & J. Borglind, "Improved InP Regrowth Properties in Metalorganic Vapor Phase Epitaxy by Addition of $CCl_4$", Appl. Phys. Lett., vol. 61, No. 1, Jul. 6, 1992, pp 22–24.

K.Nakai, T. Sanada & S. Yamakoshi, "Planar Selective Growth of InP by MOVPE", Journal of Crystal Growth, 93 (1988) pp 248–253. (No Month Available).

P.Speier, P.Wiedemann, W.Kuebart, H.GroBkopf, F.Grotjahn, F.Schuler, F.J.Tegude, K.Wünstel, "Semi–insulating Fe–doped InP Layers Grown by MOVPE", Paper presented at 5th Conf. on Semi–insulating III–V Materials, Malmö, Sweden(s) 1988; pp 295–300. (No Month Available).

D.G.Knight, B. Emmerstorfer, G.Pakulski, C.Larocque & A.J.Springthorpe, "Low Pressure MOCVD Growth of Buried Heterostructure Laser Wafers Using High Quality Semi–Insulating InP", Journal of Electronic Materials, vol. 21, No. 2, 1992, pp 165–171. (No Month Available).

| | D | E |
|---|---|---|
| | $Ga_x In_{1-x} As_y P_{1-y}$ | |
| 13 | .95um Q-layer | x=0.027, y=0.06 |
| 14 | 1.0um Q-layer | x=0.0682, y=0.15 |
| 15 | 1.05um Q-layer | x=0.107, y=0.235 |
| 16 | 1.1um Q-layer | x=0.146, y=0.319 |
| 17 | 1.15um Q-layer | x=0.181, y=0.394 |
| 18 | 1.2um Q-layer | x=0.214, y=0.467 |
| 19 | 1.3um Q-layer | x=0.280, y=0.605 |
| 20 | 1.4um Q-layer | x=0.338, y=0.730 |
| 21 | 1.5um Q-layer | x=0.392, y=0.844 |
| 22 | 1.6um Q-layer | x=0.442, y=0.947 |

Rows 15–18: BURIED HET S.I.
Rows 19–20: CIRC. GRATING WAVEGUIDE

FIG. 4

BURIED HETEROSTRUCTURE LASER WITH QUATERNARY CURRENT BLOCKING LAYER

FIELD OF INVENTION

This invention relates to a buried heterostructure semiconductor laser and more particularly to a current blocking layer for a buried heterostructure laser.

BACKGROUND OF THE INVENTION

Buried heterostructure lasers with semi-insulating blocking layers have low parasitic capacitance, an important requirement for transmitters for high speed optical communication systems.

Typically, a conventional buried heterostructure laser comprises a semiconductor substrate of a first conductivity type, an active region of another semiconductor material capable of emitting light of the required wavelength, e.g., a multiquantum well structure, and an overlying semiconductor layer of a second conductivity type. The active region is typically delineated in a lateral direction by surrounding the active region with a current blocking layer. For example the active region may be defined as a mesa structure, and a semi-insulating blocking layer is grown around sidewalls of the mesa. The blocking layer functions to direct current more effectively through the heterojunction into the active region. A blocking layer is alternatively referred to as a lateral confinement layer or lateral confinement region.

For example, Fe doped InP semi-insulating blocking layers, or lateral confinement layers, grown by metal Organic Chemical Vapour Deposition (MOCVD) have been proposed in the past for buried heterostructure lasers. During growth of InP blocking layers by MOCVD, growth near edges of dielectric masking layers advances more quickly than in the bulk, and results in defects of InP formation that are referred to as "rabbit ear" defects. Good regrowth morphology has been reported for low pressure MOCVD overgrowth of mesa oriented along the [110] direction with minimal mask overhang to prevent formation of rabbit ears, with either sloping {111} B sidewalls or vertical {011} sidewalls. Although growth on the {011} sidewalls was demonstrated by Matsumoto et al in Electronics Letters 30 (1994) 1305, InP growth with good morphology on vertical or re-entrant mesa sidewalls is difficult to achieve.

To achieve more planar regrowth morphology, addition of chlorine containing compounds such as $CCl_4$ and trichloroethane has been used. A disadvantage of using chlorine containing compounds to improve the growth is the need to adjust the growth conditions when adding these compounds. The growth rate of InP decreases as higher flows of chlorine containing compounds are used. Therefore, to use this method of regrowth the correct flow of chlorine containing compound is determined to get the best regrowth and the flow rate of the indium precursor or the growth time must be increased to compensate. Also, care must be taken to ensure that the addition of chlorine containing compounds does not add any impurities to the grown InP, or it will not be possible to make the InP layer semi-insulating for current blocking.

Thus the present invention seeks to provide a buried heterostructure laser having an improved blocking layer which overcomes or avoids the above mentioned problems.

In summary, the present invention provides a buried heterostructure semiconductor laser in which an active region is contained in a stripe delineated on opposite sidewalls by a current and light blocking layer wherein the blocking layer is a doped InGaAsP alloy, the degree of doping rendering the blocking layer semi-insulating with a bandgap wavelength less than the lasing wavelength of the laser.

According to another aspect, the invention provides a method of fabricating a buried heterostructure semiconductor laser comprising the steps of: a) epitaxially growing on a substrate active material capable of generating light and gain for lasing action; b) selectively etching said active material so as to form a linear mesa active region defined between two linear etched regions; c) regrowing InGaAsP alloy material in the linear etched regions substantially to the height of the mesa, the InGaAsP alloy having a bandgap wavelength less than the lasing wavelength of the laser; d) forming a cladding layer over the mesa and InGaAsP alloy material; e) forming a contact layer over the cladding layer; and f) forming contacts on the substrate and contact layer.

The use of a semi-insulating layer of InGaAsP has already been proposed in relation to circular grating surface emitting lasers which are largely experimental devices. See, for example, C. M. Wu et al, Photonics Technology Letters 4 (1992) 960–963, D. G. Knight et al, Journal of Crystal Growth 134 (1993) 19–28 and U.S. Pat. No. 5,448,581 issued on Sep. 5, 1995 to Wu et al.

In such circular grating lasers, the InGaAsP layer was chosen because it provided good current blocking properties and, more importantly, because its optical properties allowed it to serve as a waveguide. The waveguide function is essential to the operation of this type of laser because light generated in the active region of the laser is continuously propagated through the waveguide and is reflected back through the waveguide from one or more circular gratings until the lasing threshold is reached at which time an output beam is emitted from the surface of the device.

The Knight et al article referred to above showed that the InGaAsP layer could be successfully regrown on vertical mesa sidewalls of the active region. However, there is no suggestion in any of these references of using the InGaAsP layer as a blocking layer in a buried heterostructure laser. Nor would it be readily apparent to a person skilled in the art that this material would make a suitable blocking layer in a buried heterostructure laser primarily because, instead of a waveguiding function as in the circular grating laser, the blocking layer in the buried heterostructure laser must have the exact opposite property, i.e., light blocking capability. Light blocking capability in the current blocking layer is required so that light propagates along and is confined to the active region and eventually emerges from a cleaved end of the active region.

The present inventors are the principal authors of the Knight et al article and the Wu et al article referred to above. Despite there being a naturally widely held belief that a material selected for its light transmitting properties would be unlikely to be useful in an application which required a material with light blocking capability, the present inventors thought it might be worth researching the material for use in buried heterostructure lasers which are commercially much more significant than the circular grating laser.

Experimentation with different compounds of InGaAsP material has proven that, contrary to expectations, a blocking layer formed of InGaAsP can operate satisfactorily in a light blocking capacity in a buried heterostructure laser and, because of its good regrowth properties, is superior to InP and other conventional techniques.

BRIEF DESCRIPTION OF THE DRAWINGS

The invention will now be described in greater detail in which:

FIG. 4 is a table relating fractions of Ga, In, As and P in the GaInAsP compounds as a function of bandgap wavelength;

DETAILED DESCRIPTION OF PREFERRED EMBODIMENT

Figure 1:
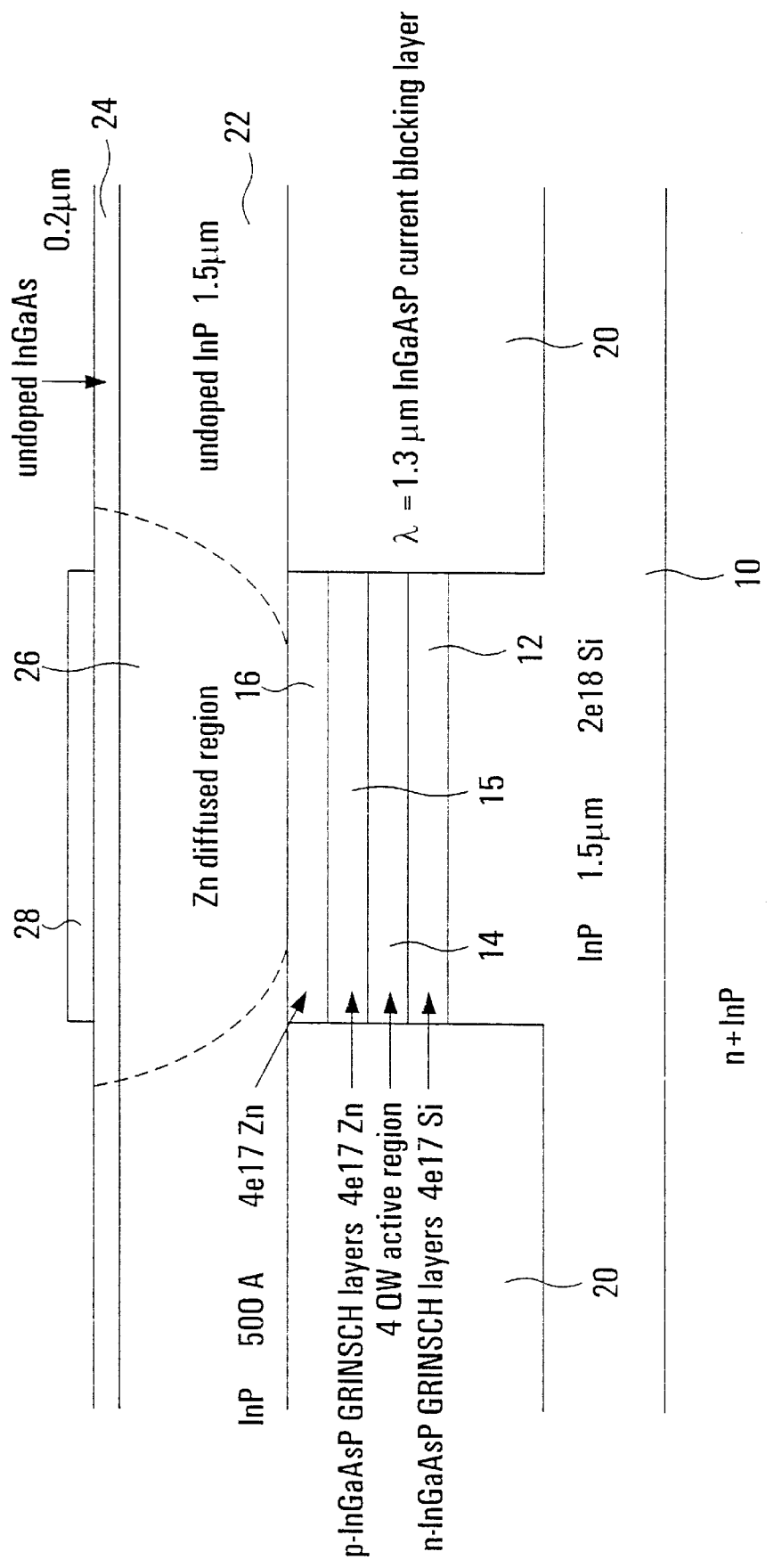
FIG. 1 is a schematic drawing of a buried heterostructure laser.
Figure 2:
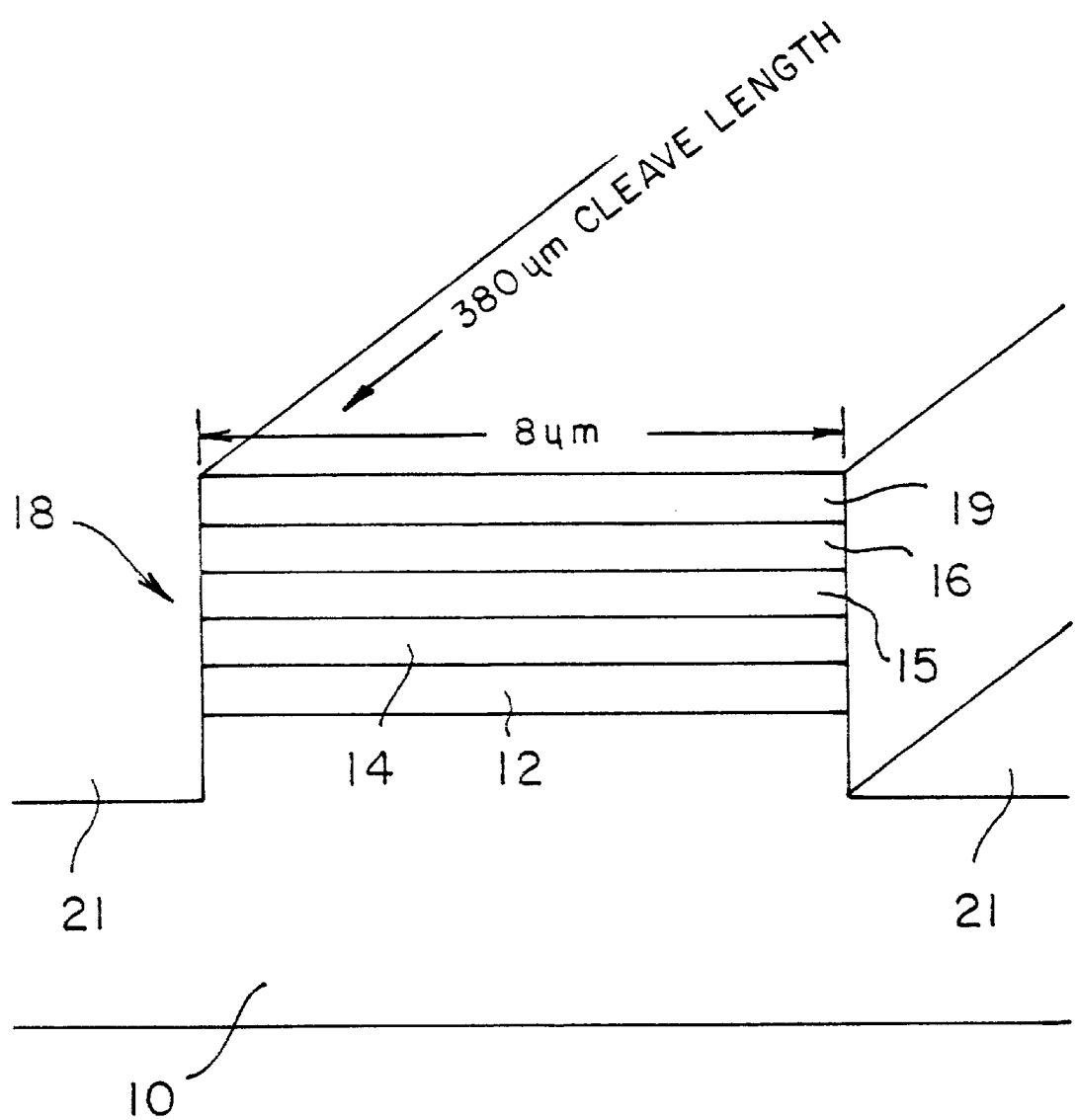
FIG. 2 is a schematic drawing showing the laser before regrowth of the current blocking layer.

FIG. 1 shows a schematic diagram of the buried heterostructure laser designed for a lasing wavelength of 1.55 µm. On a heavily n-doped InP substrate 8 a series of epitaxial layers is grown using the low pressure MOCVD technique. The first MOCVD growth consists of a 1.5 µm thick n-doped InP buffer layer 10. Thereafter four quaternary 100 Å thick (grounded index separate confinement heterostructure) GRINSCH layers 12 ($\lambda$=1.05, 1.15, 1.20 and 1.25 µm InGaAsP) and an active region 14 of the device are laid down. The active region 14 is a four active layer multiquantum well structure with 1.3% compressively strained InGaAsP active layers 49 Å thick and 100 Å thick $\lambda$=1.25 µm quaternary barrier layers. Four quaternary 100 Å thick GRINSCH layers 15 are then laid on top of active region 14. A 500 Å thick p-doped InP cap layer 16 is then grown after the upper GRINSCH layers 15. Stripe mesas 18 were then etched in the first growth structure by creating a {011} oriented dielectric stripe mask 19 which is 8 µm in width, and etching the exposed epitaxial material 0.6 µm (i.e. well below the lower GRINSCH layers 12) using $CH_4/H_2$ reactive ion etching (RIE). Thus far, the process is entirely conventional and FIG. 2 illustrates the device at this stage of the process. For further information concerning the basic theory and design of a quantum well laser reference should be made to the book "Long Wavelength Semiconductor Laser", by G. P. Agrawal and N. K. Dutta (Van Nostrand Reinhold, New York, 1986) chapter 9 the disclosure of which is incorporated herein by reference. This text does not include the more recent discovery of using strained active layers for improved performance.

Growth of a quaternary blocking layer 20 in the linear etched regions 21 defining the mesas was then conducted by low pressure MOCVD at 50 mbar reactor pressure and using ferrocene ($Fe(C_5H_5)_2$) as a source of Fe dopant. The dopant source flow was adjusted to give a Fe concentration in $\lambda$=1.3 µm InGaAsP of $5\times10^{16} cm^{-3}$, and the resistivity of this material is expected to be $\sim 1\times10^6 \Omega.cm$. Typical precursor flows to obtain lattice matched InGaAsP alloys with the Fe dopant are disclosed in D. G. Knight et al, Journal of Crystal Growth 124 (1992) 353–357 the disclosure of which is incorporated herein by reference. The dielectric stripe mask 19 was then removed and an undoped cladding layer 22 consisting of 1.5 µm InP was then grown followed by an undoped contact layer 24 consisting of 0.2 µm InGaAs. A further dielectric mask (not shown) was deposited on layer 24 and stripe openings in this dielectric mask were then made above the overgrown mesas, and Zn diffusion was performed so that a Zn diffused region 26 of the device extended to the p-InP cap layer 16. Metallic contacts were then formed on the underside of substrate 8 and on top of layer 24. The upper p-metal contacts 28 were formed as stripes aligned with the mesas 18 and are typically made of Titanium/Platinum/Gold while the lower n-metal contact was formed as a unitary contact typically made of Nickel-Germanium/Gold. The wafer was then cleaved to give devices 380 µm in length.

The InGaAsP current blocking layer may have a bandgap wavelength of $\lambda$=1.3 µm as indicated in the above example and initial tests have suggested that the regrowth morphology is superior to that of an InP blocking layer. Also the projected lifetime is similar to that of devices using InP blocking layers. The threshold current density values obtained in tests were of the order of 1.5 $kA/cm^2$ which compares favourably with the current density value of 2.3 $kA/cm^2$ for a similar laser using an InP blocking layer. This is experimental proof that light confinement produced by the quaternary blocking layer is adequate.

Improved performance is likely if the bandgap wavelength of the-InGaAsP is reduced to a range of approximately 1.0 to 1.15 µm in which range the refractive index of the InGaAsP material is lower. This lowering of the refractive index relative to the active region of the laser gives improved light confinement, i.e. restricts laser light to the active region more effectively and, indeed, the closer the index of refraction to that of InP the better the light confinement. It should be noted that this is in sharp contrast to the use of InGaAsP in a circular grating laser. In that case the preferred range for bandgap wavelength is approximately 1.3 to 1.4 µm because this provides an increased index of refraction with reference to the top and bottom InP cladding layers thereby increasing the efficiency of the waveguiding function.

Figure 3:
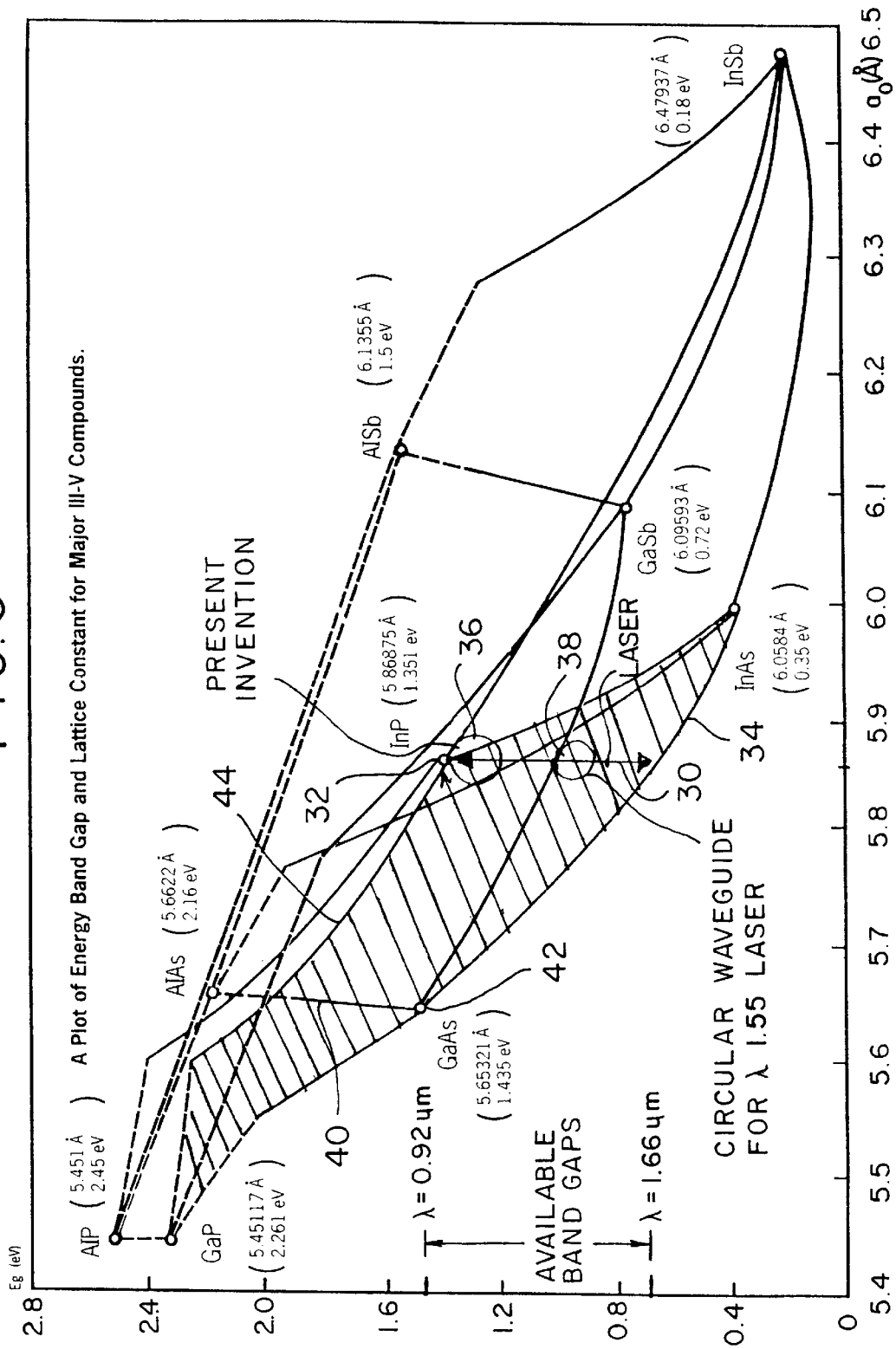
FIG. 3 is a plot of energy band gap against lattice constant for major III–V compounds.

With reference to FIG. 3 the shaded portion represents all possible combinations of In, Ga, As and P forming InGaAsP alloys. For an InGaAsP alloy suitable for epitaxial growth on InP, the two materials must be lattice matched i.e., the lattice constant of InGaAsP must be the same as InP. Thus, the InGaAsP must be chosen such that it lies on the vertical line 30 extending vertically down from the InP location 32 and intersecting the GaAs to InAs line 34. As can be seen, the preferred location for the material used in the present invention is indicated by circle 36 which corresponds to the bandgap wavelength range 1.0–1.15 µm mentioned earlier while for a circular grating wavelength circle 38 represents the preferred range.

Referring now to FIG. 4 the values of x and y for the desired bandgap wavelength range can be obtained for $Ga_xIn_{1-x}As_yP_{1-y}$.

The present invention has been described for a laser designed to operate at 1.55 µm. For a laser designed to work at 1.3 µm, as is well known in the art the makeup of the active region and GRINSCH layers would be changed. Specifically the active region would comprise strained $\lambda$=1.3 µm layers sandwiched between $\lambda$=1.1 µm barrier layers, and the GRINSCH layers that surround the active layer structure on top and bottom would have an altered composition (200 Å thick layers of $\mu$=1.1 µm and $\lambda$=1.0 µm InGaAsP).

It is noted that for a 1.3 µm laser the bandgap wavelength of the current and light blocking layer must be less than 1.3 µm (as opposed to less than 1.55 µm for a 1.55 µm laser) to avoid light absorption. As with the 1.55 µm laser, the maximum bandgap difference between active layer and current blocking layer would give the maximum difference in the index of refraction and therefore the best light confinement. Thus the preferred bandgap wavelength of the blocking layer is, as before, λ≈1.0–1.15 μm.

While the laser described with reference to FIGS. 1 and 2 is based on a InP system it is believed that other systems falling on the periphery of the shaded area of FIG. 3 could be used, such as GaAs. For a laser grown in a GaAs substrate the emission wavelength of the laser will be considerably shorter than that obtained in an InP laser. As can be seen in FIG. 3 to provide an InGaAsP composition which is lattice matched to the GaAs, the InGaAsP must be chosen to be on the vertical line 40 extending up from the GaAs location 42 and intersecting the GaP to InP curved line 44. This gives a bandgap wavelength range of ~0.65 to 0.85 μm for suitable InGaAsP materials lattice matched to GaAs. Whatever the InGaAsP material chosen it must have a bandgap wavelength less than the emission wavelength.

It should be noted also that the active layers for GaAs based lasers are GaAs or InGaAs as opposed to InGaAsP for InP based lasers. In addition, AlGaAs or GaInP would be used for lower cladding layer 10 as well as for layers 16 and 22 while GaAs would be used for contact layer 24.

Although the invention has been described as applied to a buried heterostructure laser using a multi-quantum well structure for the active region, it is to be understood that the invention is not limited to use with a specific type of active region. More specifically, a bulk quaternary active layer (typically a 0.2 μm thick single layer of InGaAsP) instead of lattice matched or strained layer quantum wells can be used. The basis for choosing the optimum bandgap for the blocking layer is unchanged.

Figure 5:
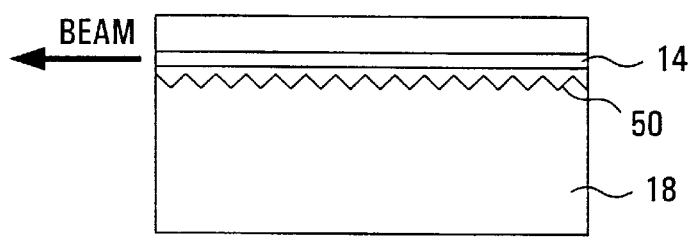
FIG. 5 is a schematic diagram illustrating the stripe in a distributed feedback laser which can be adapted for use with the invention.

It is to be understood that the present invention is applicable not only to conventional buried heterostructure lasers but also to modified versions of the conventional buried heterostructure lasers such as buried heterostructure distributed feedback lasers and buried heterostructure distributed Bragg reflector lasers as shown in FIG. 5.

Figure 6:
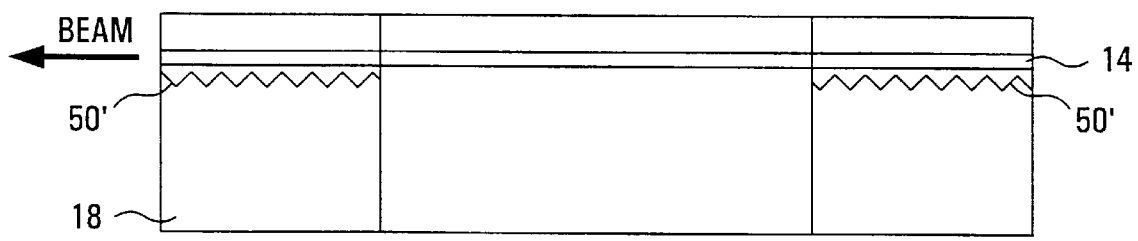
FIG. 6 is a schematic diagram illustrating the stripe in a distributed Bragg reflector laser which can be adapted for use with the invention.

In a distributed feedback laser, a feedback grating 50' etched in one of the cladding layers next to the active layer allows for single mode operation of the laser. When incorporated in a buried heterostructure laser the features of single-mode operation and low parasitic capacitance can be obtained in the same device. In the distributed Bragg reflector laser as shown in FIG. 6, a grating 50' is etched adjacent both edges of the active regions.

In applying the present inventive concept to these two types of buried heterostructure lasers the gratings would be contained within the etched stripe 18 and the current blocking layer would then be grown around the stripe.

What is claimed is:

1. A buried heterostructure semiconductor laser in which an active region is contained in a stripe delineated on opposite sidewalls by a current and light blocking layer wherein the blocking layer is a doped InGaAsP alloy, the degree of doping and type of dopant rendering the blocking layer semi-insulating with a bandgap wavelength less than the lasing wavelength of the laser.

2. A laser according to claim 1 wherein the active region has opposite sidewalls which define at least a portion of the opposite sidewalls of the stripe.

3. A laser according to claim 2 wherein the laser is a distributed feedback laser having a grating in the stripe adjacent the active region.

4. A laser according to claim 1 wherein the laser is a distributed Bragg reflector laser having gratings extending adjacent opposite sidewalls of the active region, both gratings being contained in the stripe.

5. A laser according to claim 1 wherein the active region is formed as InGaAsP alloy layers formed on a substrate of InP and having a cladding layer of InP overlying the stripe and the blocking layer.

6. A laser according to claim 1 wherein the active region is formed as InGaAs alloy layers formed on a substrate of GaAs and having a cladding layer of AlGaAs or GaInP overlying the stripe and the blocking layer.

7. A laser according to claim 1 wherein the active region is formed as GaAs layers formed on a substrate of GaAs and having a cladding layer of AlGaAs or GaInP overlying the stripe and the blocking layer.

8. A laser according to claim 5 wherein the doped InGaAsP alloy of the blocking layer is selected to have a bandgap wavelength substantially in the range 1.0 to 1.15 μm.

9. A laser according to claim 6 wherein the doped InGaAsP alloy of the blocking layer is selected to have a bandgap wavelength substantially in the range 0.65 to 0.85 μm.

10. A laser according to claim 7 wherein the doped InGaAsP alloy of the blocking layer is selected to have a bandgap wavelength substantially in the range 0.65 to 0.85 μm.

11. A laser according to claim 1, wherein the doped InGaAsP alloy of the blocking layer is selected to have a bandgap wavelength of approximately 1.3 μm.

12. A laser according to claim 1, wherein the blocking layer is Fe-doped InGaAsP alloy.

13. A laser according to claim 2, wherein the blocking layer is Fe-doped InGaAsP alloy.

14. A laser according to claim 3, wherein the blocking layer is Fe-doped InGaAsP alloy.

15. A laser according to claim 4, wherein the blocking layer is Fe-doped InGaAsP alloy.

16. A laser according to claim 5, wherein the blocking layer is Fe-doped InGaAsP alloy.

17. A laser according to claim 6, wherein the blocking layer is Fe-doped InGaAsP alloy.

18. A laser according to claim 7, wherein the blocking layer is Fe-doped InGaAsP alloy.

19. A laser according to claim 8, wherein the blocking layer is Fe-doped InGaAsP alloy.

20. A laser according to claim 9, wherein the blocking layer is Fe-doped InGaAsP alloy.

21. A laser according to claim 10, wherein the blocking layer is Fe-doped InGaAsP alloy.

22. A buried heterostructure semiconductor laser comprising a substrate of heavily n-doped InP, an n-doped buffer layer on the substrate, a stripe etched into the buffer layer and containing in addition to an uppermost portion of the buffer layer, lower GRINSCH layers of InGaAsP alloy on the buffer layer, an active region of InGaAsP on the lower GRINSCH layers, upper GRINSCH layers on the active region and a p-doped InP cap layer on the upper GRINSCH layers, the stripe having opposite sidewalls delineated by a current and light blocking doped InGaAsP alloy layer, the degree of doping and type of dopant rendering the blocking layer semi-insulating with a bandgap wavelength less than the lasing wavelength of the laser, and a layer of InP overlying the stripe and the blocking layer.

23. A laser according to claim 22, wherein the blocking layer is Fe-doped InGaAsP alloy.

* * * * *